United States Patent
Park et al.

(10) Patent No.: US 6,420,234 B1
(45) Date of Patent: Jul. 16, 2002

(54) SHORT CHANNEL LENGTH TRANSISTOR AND METHOD OF FABRICATING THE SAME

(75) Inventors: Byung Gook Park; Dae Hwan Kim, both of Seoul (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/531,127

(22) Filed: Mar. 17, 2000

(30) Foreign Application Priority Data

Mar. 19, 1999  (KR) .............................. 99-9442

(51) Int. Cl.[7] .......................................... H01L 21/336
(52) U.S. Cl. ...................... 438/259; 438/267; 438/289; 438/596
(58) Field of Search ................................ 438/257, 259, 438/265, 267, 289, 593, 595, 596

(56) References Cited

U.S. PATENT DOCUMENTS

| | | | |
|---|---|---|---|
| 5,434,093 A | | 7/1995 | Chau et al. ................. 438/300 |
| 5,879,998 A | * | 3/1999 | Krivokapic ................. 438/291 |
| 6,025,232 A | * | 2/2000 | Wu et al. ................... 438/270 |
| 6,093,945 A | * | 7/2000 | Yang .......................... 257/316 |

OTHER PUBLICATIONS

Hisao Kawaura et al., "Fabrication and Characterization of 14-nm-Gate-Length EJ-MOSFETs," 1997 International Conference on Solid State Devices and Materials,, Hamamatsu, 1997, 572–573.

* cited by examiner

*Primary Examiner*—Carl Whitehead, Jr.
*Assistant Examiner*—Jamie L. Brophy
(74) *Attorney, Agent, or Firm*—Morgan, Lewis & Bockius LLP

(57) ABSTRACT

Transistor and method for fabricating the same, which can form a channel length shorter than a lithography limit and adjust a substrate impurity concentration variably, the method including the steps of (1) depositing an insulating film on a semiconductor substrate and forming a trench to expose the semiconductor substrate, (2) forming two side gates at sides of the trench, (3) forming a main gate over the semiconductor substrate between the side gates, and (4) removing the insulating film, and using the main gate and the side gates as masks in forming source/drain impurity regions in the semiconductor substrate on sides of the side gates.

9 Claims, 9 Drawing Sheets

SHORT CHANNEL LENGTH TRANSISTOR AND METHOD OF FABRICATING THE SAME

This application claims the benefit of Korean Patent Application No. 9442/1999, filed on Mar. 19, 1999, which is hereby incorporated by reference.

BACKGROUND OF THE INVENTION

1. Field of the Invention

The present invention relates to a transistor, and more particularly, to a tri-gate MOSFET and a method for fabricating the same.

2. Background of the Related Art

Field effect transistors which have three gate electrodes disposed in a row along a channel region between source/drain have been used in research on influences of a very shallow junction in a short channel MOSFET to the short channel effect, such as a threshold voltage roll-off, and in research on hot carrier injection from an MOSFET channel. FIG. 1 illustrates a section of a first exemplary related art tri-gate transistor, and FIG. 2 illustrates a section of a second exemplary related art tri-gate transistor.

In the first exemplary related art tri-gate transistor, a bias on the side gates forms inversion layers in respective channel regions, so that the respective inversion layers connect $n^+$ source/drain regions formed by ion implantation to a main gate channel. The inversion layers formed thus become source/drain regions having very low junction depths with respect to a main gate, and fields and potential distributions in respective channels and charge concentrations in respective inversion layers can be varied with the voltages on respective side gates. In tests studying a mechanism of hot carrier injection using a tri-gate transistor, test conditions may be varied freely by varying a main gate bias and a drain side gate bias of vertical and horizontal fields of a hot electron injection point from the channel, and by varying a current in a channel by varying a source side gate bias. If the current is regulated at a low level, parameters which influence to a hot carrier injection can be extracted by measuring gate and substrate currents while not disturbing a field distribution in the channel. The inversion layers formed by the side gate biases can be used as source/drain of an MOSFET. In this instance, the source/drain have junction depths ranging several nanometers, and the MOSFET is operative as a device having source/drain aligned exactly at rims or edges of a gate. The use of very shallow source/drain can effectively prevent the short channel effects, such as threshold voltage roll-off and DIBL (Drain Induced Barrier Lowering), which are due to the infiltration of the electric field of the MOSFET drain toward the channel. And, since it is impossible to form source/drain regions by ion implantation in a case when a size of a gate pattern in a range of several tens of a nanometer is formed by an advanced lithography, use of such an inversion layer as a form of source/drain that is aligned exactly to a gate is suggested as an alternative.

A related art tri-gate transistor will be explained with reference to the attached drawings.

Referring to FIG. 1, the related art tri-gate transistor is provided with a main gate 5 formed on a p type semiconductor substrate 1, and a gate insulating film 4 between the main gate 5 and the semiconductor substrate. And, there is a thin insulating film 6 (oxide film) formed on a surface of the main gate 5, two side gates 7 and 8 on the insulating film 6 at both sides of the main gate 5, and heavily doped n type source/drain impurity regions 2 and 3 in the semiconductor substrate 1 on both sides of the side gates 7 and 8.

And, referring to FIG. 2, another related art tri-gate transistor is provided with a main gate 5 with sloped opposite sides formed on a p type semiconductor substrate 1, and a gate insulating film 4 formed between the main gate 5 and the semiconductor substrate. And, there are a thin insulating film 6 (oxide film) formed on a surface of the main gate 5, two side gates 7 and 8 formed on the insulating film 6 at both sides of the main gate 5, heavily doped n type source/drain impurity regions 2 and 3 in the semiconductor substrate 1 on both sides of the side gates 7 and 8. A portion of each of the two side gates 7 and 8 is overlapped with the main gate 5.

A method for fabricating the aforementioned related art transistor will be explained. FIGS. 3a~3c illustrate sections showing the steps of a method for fabricating a transistor.

Referring to FIG. 3a, the method for fabricating the aforementioned related art transistor starts from forming a gate insulating film 4 on a p type semiconductor substrate 1, and implanting ions into the semiconductor substrate 1 for the first time for adjusting a threshold voltage. Then, polysilicon is deposited on the gate insulating film 4 and the polysilicon and the gate insulating film 4 are selectively removed by photolithography or E-beam to form a main gate 5. As shown in FIG. 3b, the main gate 5 is used as a mask in implanting ions into the semiconductor substrate 1 for the second time for adjusting the threshold voltage. And, a thin insulating film 6 is formed on an entire surface of the substrate inclusive of the main gate 5, and polysilicon 9 is deposited on the insulating film 6. As shown in FIG. 3c, the polysilicon is subjected to anisotropic etching, to form two side gates 7 and 8 on the insulating film 6 at both sides of the main gate 5, and the main gate 5 and the two side gates 7 and 8 are used as masks in heavily implanting n type impurity ions into the semiconductor substrate, to form n type source/drain impurity regions 2 and 3.

However, the aforementioned related art tri-gate transistor has the following problems.

First, because the main gate is formed by photolithography or E-beam in the method for fabricating the related art tri-gate transistor, the length of the main gate can not be formed shorter than the limit of the lithography. Therefore, a tri-gate transistor with a very short channel length can not be fabricated.

Second, the formation of the side gates after formation of the main gate in the method for fabricating the related art tri-gate transistor leads to impurity concentrations under the side gates being equal to or higher than an impurity concentration under the main gate, always. That is, threshold voltages of MOS capacitors at the side gate sides are higher than that at the main gate side, requiring application of substantially higher voltages to the side gates for inducing an inversion layer charge adequate for operation. Thus causes a problem of insulation breakdown if the oxide film between the gates is thin.

SUMMARY OF THE INVENTION

Accordingly, the present invention is directed to a tri-gate transistor and a method for fabricating the same that substantially obviates one or more of the problems due to limitations and disadvantages of the related art.

An object of the present invention is to provide a tri-gate transistor and a method for fabricating the same, which allows formation of a channel length shorter than a lithography limit and a variety of substrate impurity concentration adjustments.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the transistor includes first and second side gates formed on a semiconductor substrate at sides of a trench, wherein a gap is formed between the first and second side gates, a main gate formed in and over the gap and over the first and second side gates on the semiconductor substrate, wherein the main gate is wider than the gap and overlaps the first and second side gates, an insulating film formed between the semiconductor substrate and the first side gate, second side gate, and the main gate and between the first and second side gates and the main gate, and the semiconductor substrate and between the first and second side gates and the main gate, and source/drain impurity regions formed in the semiconductor substrate on sides of the first and second side gates.

In another aspect of the present invention, there is provided a method for fabricating a transistor including the steps of (1) depositing an insulating film on a semiconductor substrate and forming a trench to expose the semiconductor substrate, (2) forming two side gates at sides of the trench, (3) forming a main gate over the semiconductor substrate between the side gates, and (4) removing the insulating film, and using the main gate and the side gates as masks in forming source/drain impurity regions in the semiconductor substrate on both sides of the side gates.

In another aspect of the present invention, there is provided a method for fabricating a semiconductor device including the steps of (1) forming an insulating film on a first conduction type semiconductor substrate, (2) selectively removing the insulating film to expose the semiconductor substrate to form a trench, (3) implanting ions into the exposed semiconductor substrate for adjusting a threshold voltage for a first time, (4) forming a first gate insulating film on a surface of the exposed semiconductor substrate, (5) forming a first and a second side gates on the first gate insulating film at sides of the trench, (6) removing the first gate insulating film between the first and second side gates, (7) injecting ions into the exposed semiconductor substrate for adjusting the threshold voltage for a second time, (8) forming a second gate insulating film on surfaces of the first and second side gates and the exposed semiconductor substrate, (9) forming a main gate on the second gate insulating film between the first and second side gates, and (10) removing the second gate insulating film and forming source/drain impurity regions in the semiconductor substrate on sides of the first and second side gates.

In another aspect of the present invention, there is provided a method for fabricating a semiconductor device, comprising the steps of (1) forming a buffer oxide film and a nitride film on a first conduction type semiconductor substrate, (2) selectively removing the buffer oxide film and the nitride film to expose the semiconductor substrate and form a trench, (3) implanting B ions into the exposed semiconductor substrate for adjusting a threshold voltage for a first time, (4) forming oxide film sidewalls at inside walls of the trench, (5) forming a first gate insulating film on a surface of the exposed semiconductor substrate, (6) forming a first and a second side gates on the first gate insulating film at sides of the trench, (7) removing the first gate insulating film between the first and second side gates, (8) injecting $BF_2$ ions into the exposed semiconductor substrate for adjusting the threshold voltage for a second time, (9) forming a second gate insulating film on surfaces of the first and second side gates and the exposed semiconductor substrate, (10) forming a main gate on the second gate insulating film between the first and second side gates, (11) forming an oxide film on a surface of the main gate, and (12) removing the nitride film using phosphoric acid solution, and forming source/drain impurity regions in the semiconductor substrate on sides of the first and second side gates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
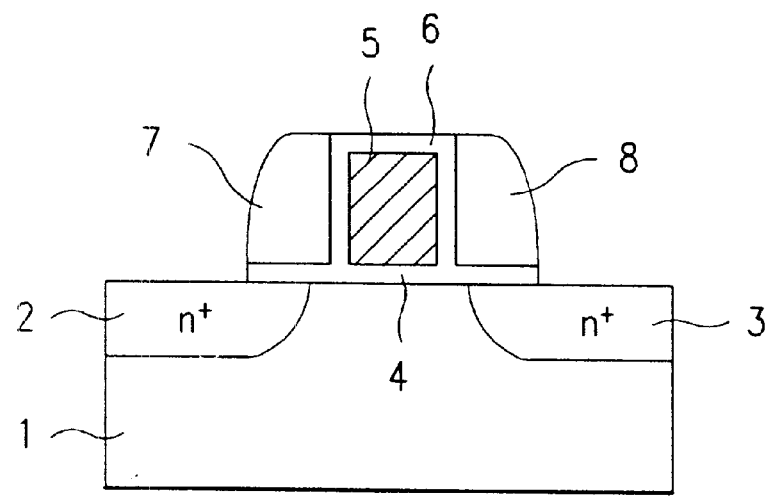
FIG. 1 is a sectional view of a first exemplary related art tri-gate transistor.
Figure 2:
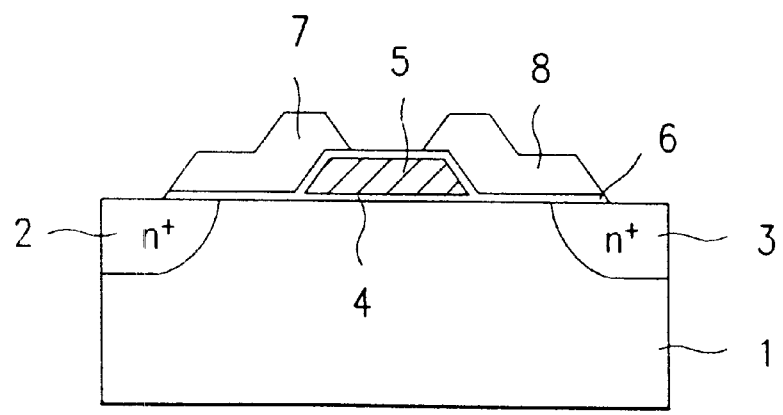
FIG. 2 is a sectional view of a second exemplary related art tri-gate transistor.
Figure 3A:
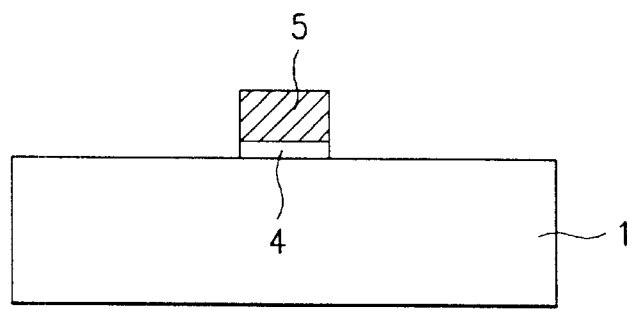
FIGS. 3a~3c are sectional views showing the steps of a method for fabricating a related art tri-gate transistor.
Figure 3B:
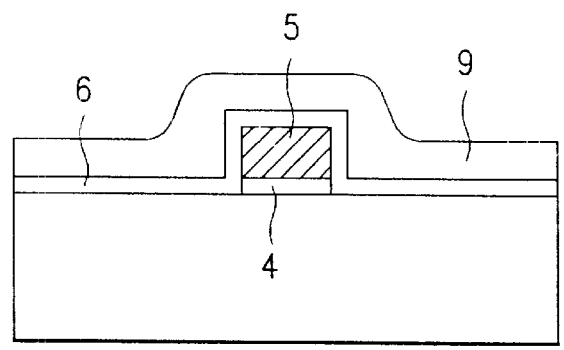
Figure 3C:
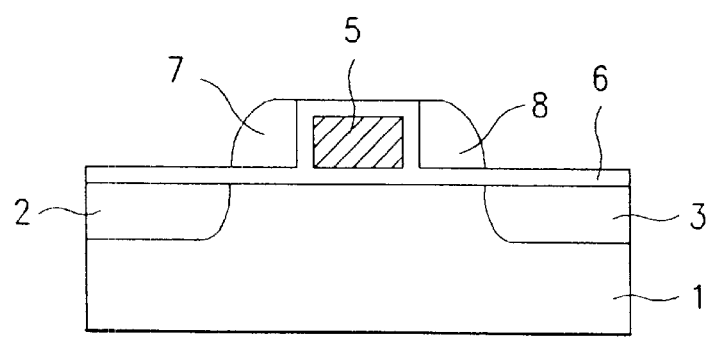
Figure 4:
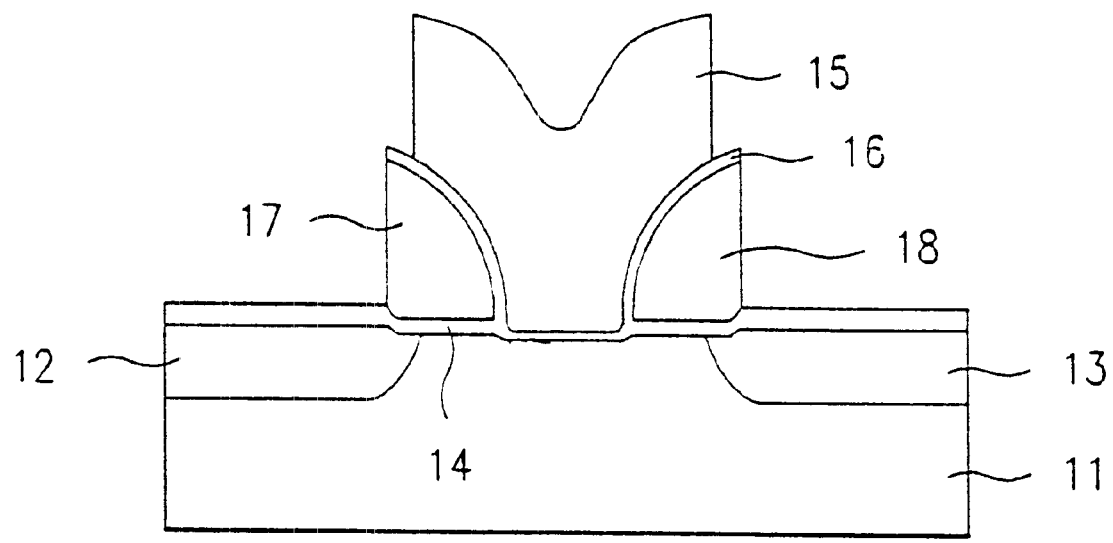
FIG. 4 is a sectional view of a tri-gate transistor in accordance with a first preferred embodiment of the present invention.

Reference will now be made in detail to the preferred embodiments of the present invention, examples of which are illustrated in the accompanying drawings. FIG. 4 illustrates a section of a tri-gate transistor in accordance with a first preferred embodiment of the present invention, and FIGS. 5a~5g illustrate sections showing the steps of a method for fabricating a tri-gate transistor shown in FIG. 4.

Referring to FIG. 4, the tri-gate transistor in accordance with a first preferred embodiment of the present invention includes two side gates 17 and 18 formed over a P type semiconductor substrate 11, and a main gate 15 formed over the semiconductor substrate 11 and between the side gates 17 and 18. There are source/drain impurity regions 12 and 13 each formed in the semiconductor substrate 11 of each side of the two side gates 17 and 18, respectively, and a gate insulating film 14 and 16 between the side gates 17 and 18 and the semiconductor substrate 11 and between the main gate 15 and the side gates 17 and 18 and the semiconductor substrate 11.

The method for fabricating the aforementioned tri-gate transistor in accordance with a first preferred embodiment of the present invention will be explained.

Figure 5A:
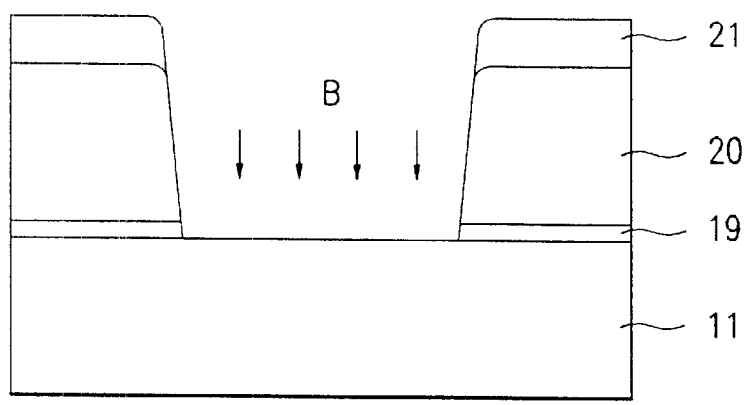
FIGS. 5a~5g are sectional views showing the steps of a method for fabricating a tri-gate transistor in accordance with a first preferred embodiment of the present invention.
Figure 5B:
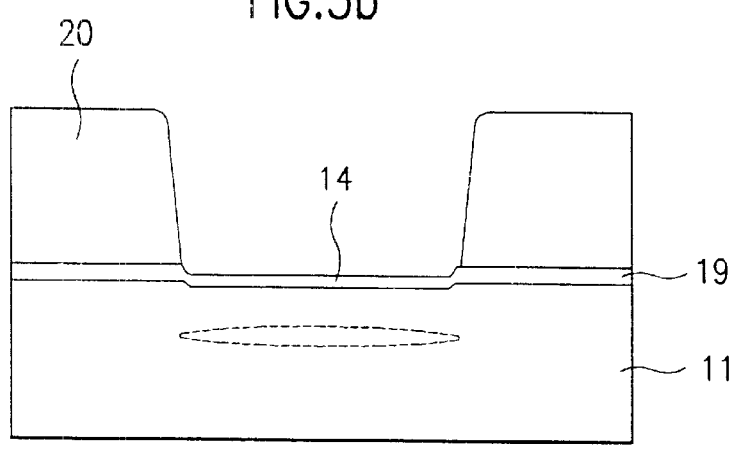
Figure 5C:
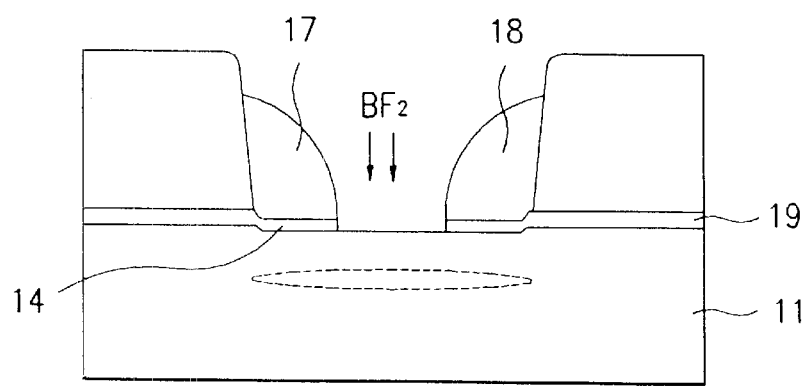
Figure 5D:
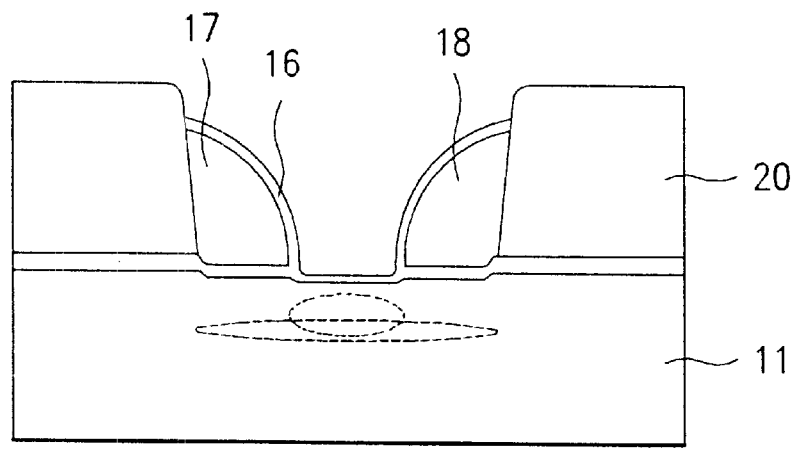
Figure 5E:
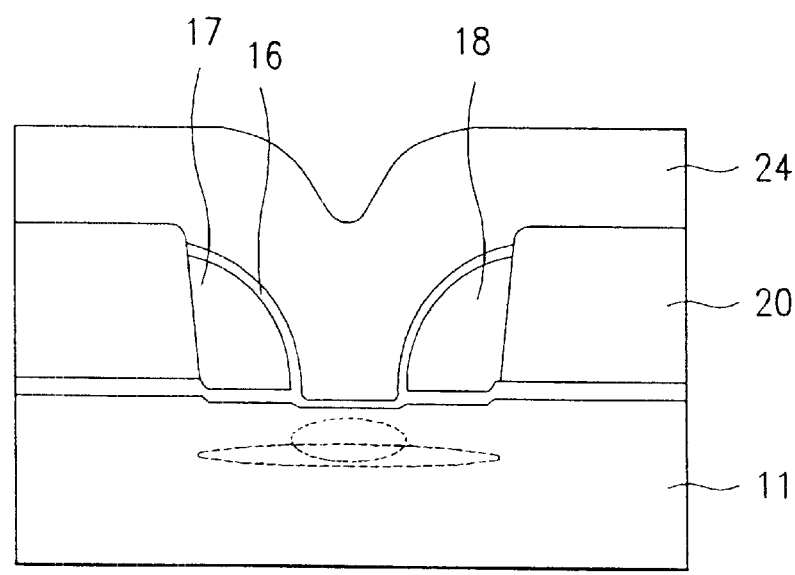
Figure 5F:
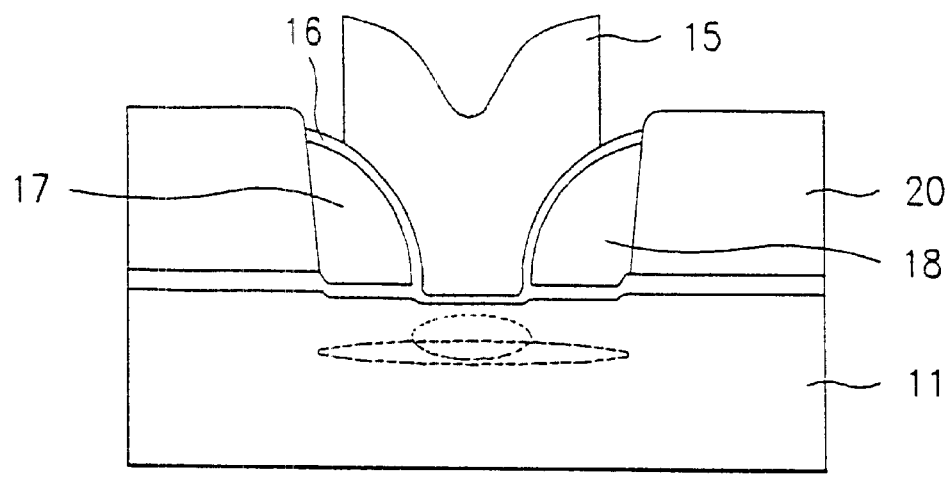
Figure 5G:
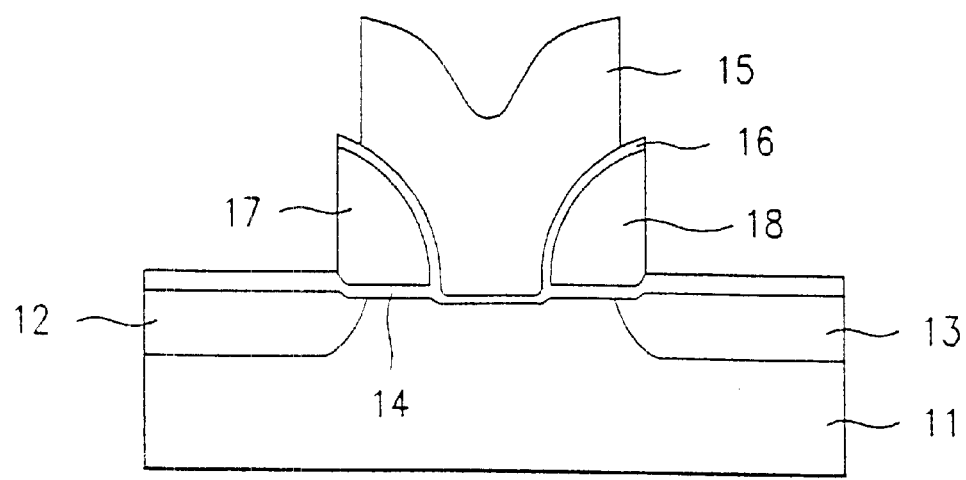

Referring to FIG. 5a, a buffer oxide film 19, a nitride film 20, and a photoresist film 21 are deposited on a p type semiconductor substrate in succession. A region at which a gate is to be formed is defined by photolithography or E-beam direct writing, and the nitride film 20 and the buffer oxide film 19 are selectively removed to expose the semiconductor substrate 11, to form a trench. A thickness of the nitride film 20 is a parameter for determining a form of a side gate together with a width of the trench formed by dry etching and a thickness of a side gate polysilicon to be deposited. With a good adjustment of the width of the trench and the form of the inverted sidewall which will act as the side gate, an MOSFET having a gate length shorter than a minimum line width obtainable by a photoetching or E-beam direct writing can be fabricated. Thereafter, ions (B) are implanted into exposed semiconductor substrate 11 for the first time for adjusting a threshold voltage. As shown in FIG. 5b, the photoresist film 21 is removed, and an oxide film is formed by thermal oxidation on a surface of the exposed semiconductor substrate 11 for use as a first gate insulating film 14. As shown in FIG. 5c, polysilicon is deposited on an entire surface, subjected to anisotropic etching to form a first and a second side gates 17 and 18, each having a rounded portion, on the gate insulating film 14 at both sides of the trench such that the rounded portions are facing each other, and a portion of the gate insulating film 14 between the first and second side gates 17 and 18 is removed. And, the nitride film 20 and the first and second side gates 17 and 18 are used as masks in injecting ions ($BF_2$) into the exposed semiconductor substrate 11 for adjusting a threshold voltage. As shown in FIG. 5d, an oxide film is grown by thermal oxidation on surfaces of the first and second side gates 17 and 18 and the exposed semiconductor substrate, to form a main gate insulating film 16. As shown in FIG. 5e, main gate polysilicon 24 is deposited on an entire surface of the substrate inclusive of the nitride film 20 and the main gate insulating film 16. As shown in FIG. 5f, the polysilicon 24 is selectively removed by photolithography or E-beam direct writing, to form a main gate 15 overlapping the rounded portions of the first and second side gates. As shown in FIG. 5g, a selective etching solution is used in removing the nitride film 20, and the main gate 15 and the first and second side gates 17 and 18 are used as masks in injecting n type impurity ions into the semiconductor substrate 11, to form source/drain impurity regions 12 and 13 to complete fabrication of a tri-gate transistor.

In the method for fabricating a tri-gate transistor in accordance with a first preferred embodiment of the present invention, if phosphoric acid is used in etching the nitride film 20 to remove the nitride film 20 as shown in FIG. 5f, portions of the exposed main gate 15 electrode and the side gate 17 and 18 electrodes are vulnerable to damage, because an etch selectivity between the nitride film 20 and the doped polysilicon is not high (the doped polysilicon has an etch rate of 13 Å/min. and the nitride film has an etch rate of 40 Å/min. and a thermal oxide film and a TEOS oxide film has an etch rate of 1~4 Å/min. in phosphoric acid at 160° C.).

A method for fabricating a tri-gate transistor in accordance with a second preferred embodiment of the present invention, which is applicable to the aforementioned case will be explained. FIGS. 6a~6d illustrate sections showing the steps of a method for fabricating a tri-gate transistor in accordance with a second preferred embodiment of the present invention.

Figure 6A:
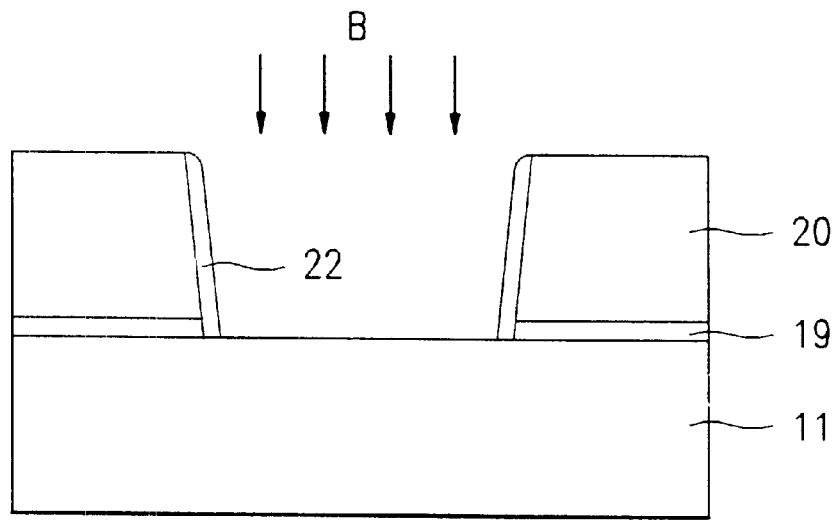
FIGS. 6a~6d are sectional views showing the steps of a method for fabricating a tri-gate transistor in accordance with a second preferred embodiment of the present invention; and, FIG. 7 is a sectional view of a tri-gate transistor in accordance with a third preferred embodiment of the present invention.
Figure 6B:
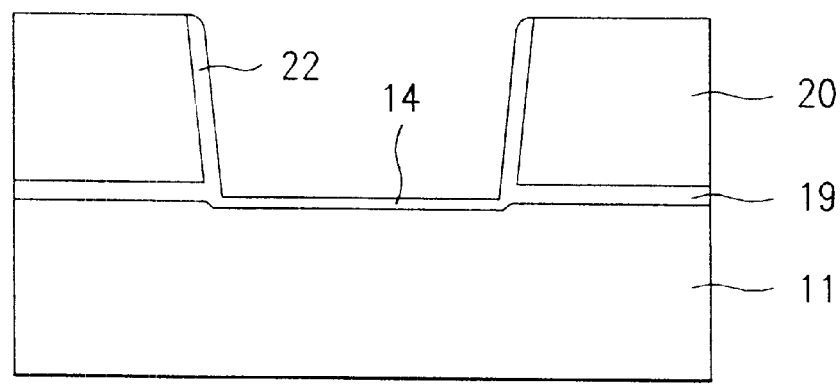
Figure 6C:
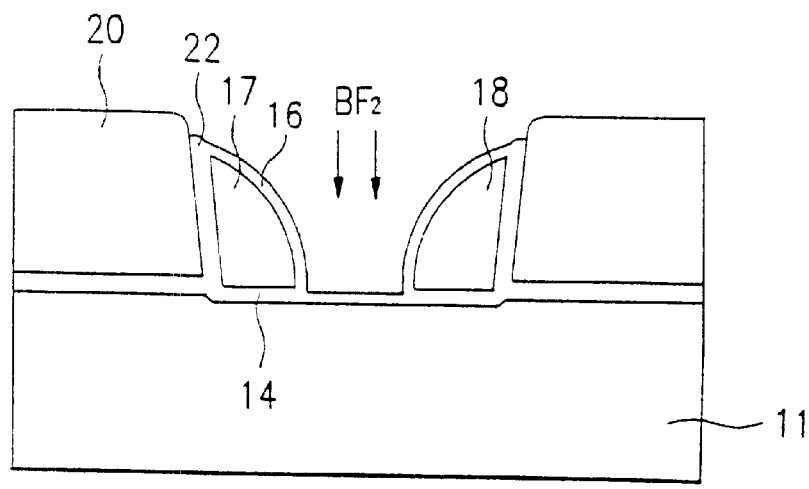
Figure 6D:
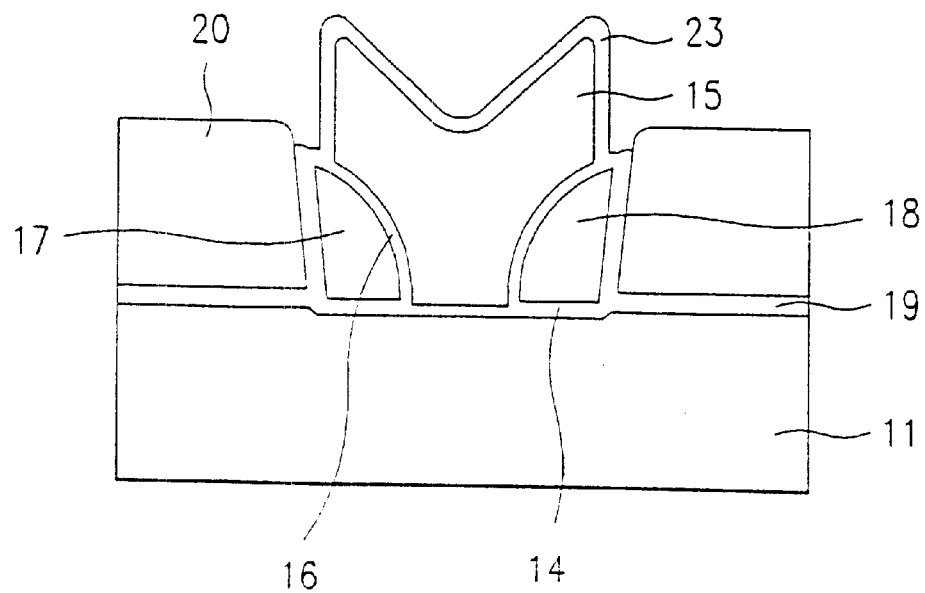

Referring to FIG. 6a, a buffer oxide film 19, a nitride film 20 and a photoresist film are deposited on a p type semiconductor substrate 11 in succession. And, a region at which a gate is to be formed is defined by photolithography or E-beam direct writing, and the nitride film 20 and the buffer oxide film 19 are selectively removed to expose the semiconductor substrate 11, to form a trench. A thickness of the nitride film 20 is a parameter for determining a form of a side gate together with a width of the trench formed by dry etching and a thickness of a side gate polysilicon to be deposited. With a good adjustment of the width of the trench and the form of the inverted sidewall which will act as the side gate, an MOSFET having a gate length shorter than a minimum line width obtainable by a photoetching or E-beam direct writing can be fabricated. Thereafter, ions (B) are implanted into exposed semiconductor substrate 11 for the first time for adjusting a threshold voltage, the photoresist film is removed, and sidewall oxide films 22 are formed at sides of the buffer oxide film 19 and the nitride film 20 inside of the trench. As shown in FIG. 6b, an oxide film is formed on a surface of the exposed semiconductor substrate 11 for use as a first gate insulating film 14. As shown in FIG. 6c, polysilicon is deposited on an entire surface, and subjected to anisotropic etching to form a first and a second side gates 17 and 18 on the gate insulating film 14 at both sides of the trench, and a portion of the gate insulating film 14 between the first and second side gates 17 and 18 are removed. And, the nitride film 20 and the first and second side gates 17 and 18 are used as masks in implanting ions ($BF_2$) into the exposed semiconductor substrate 11 for adjusting the threshold voltage for the second time, and an oxide film is grown on surfaces of the first and second side gates 17 and 18 and the exposed semiconductor substrate 11, again, to form a main gate insulating film 16. As shown in FIG. 6d, a main gate polysilicon is deposited on an entire surface of the substrate inclusive of the nitride film 20 and the main gate insulating film 16, and selectively removed by photolithography or E-beam direct writing, to form a main gate 15. And, an oxide film 23 is formed on a surface of the main gate 15. And, though not shown in the drawing, as shown in FIG. 5g., a phosphoric acid solution is used in removing the nitride film 20, and the main gate 15 and the first and second side gates 17 and 18 are used as masks in implanting n type impurity ions into the semiconductor substrate 11, to form source/drain impurity regions 12 and 13, to complete fabrication of a tri-gate transistor.

In the main gate 15 patterning in the first and second embodiments, there are cases when an alignment of the main gate and the side gates is difficult when photolithography or the E-beam direct writing is used. In such cases, the main gate may be patterned in self-alignment as shown in FIG. 7.

Figure 7:
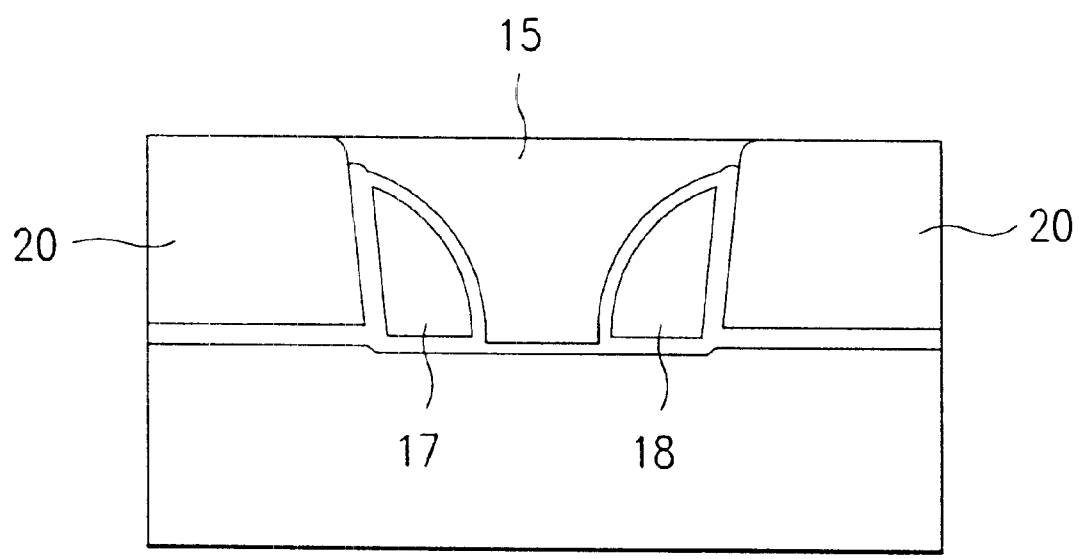

The main gate 15 can be formed in a self-alignment by polishing the polysilicon 24 deposited on the entire surface of the substrate, as shown in FIG. 5e, by CMP (Chemical Mechanical Polishing) until a surface of the nitride film 20 is exposed, as shown in FIG. 7.

As has been explained, the tri-gate MOSFET and the method for fabricating the same have the following advantages.

First, an effective channel length of a main gate can be formed shorter by the length of the two side gates from a width of trench by forming the trench by photolithography or E-beam, forming side gates at sides of inside of the trench, and forming the main gate between the side gates. Thus, by adjusting a size of sidewall used as the side gates, fabrication of an MOSFET having very short channel length is possible.

Second, the selective channel ion implantation into the main gate region and the side gate regions during a device fabrication process allows a variety of adjustment of a substrate impurity concentration. For example, a deep ion implantation may be made before formation of the side gates for preventing punch through, and the side gates may be formed and used as ion injection masks in making a shallow ion injection into the main gate only, thereby adjusting the threshold voltage. Thus, threshold voltages of the side gates and the main gate can be adjusted individually. Particularly, since the threshold voltage of the side gates can be made lower, the device can be made operative at a lower side gate bias. And, because an impurity concentration of the channel region becomes lower as it goes toward the source/drain impurity regions, an intensity of electric field at a drain junction as well as a junction capacitance can be reduced.

Third, the tri-gate transistor can be used as an MOSFET having very shallow source/drain junction depths by applying a bias higher than the threshold voltage to the side gates, which forms inverted layers in side gate channel regions, and can also be used as a 3-input NAND gate if the three gates are used as input terminals. And, if one of the side gates is used as a floating gate without applying a bias, the tri-gate transistor has application as a nonvolatile memory, such as an EEPROM, when the other side gate may be utilized as a select gate.

It will be apparent to those skilled in the art that various modifications and variations can be made in the tri-gate transistor and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a transistor, comprising the steps of:
   (1) depositing an insulating film on a semiconductor substrate and forming a trench to expose the semiconductor substrate;
   (2) forming two side gates at sides of the trench;
   (3) forming a main gate over the semiconductor substrate between the two side gates;
   (4) removing the insulating film and forming source/drain impurity regions in the semiconductor substrate on sides of the two side gates by using the main gate and the two side gates as masks; and,
   (5) injecting ions into the semiconductor substrate for adjusting a threshold voltage for a first time after the step of forming a trench, and injecting ions into the semiconductor substrate for adjusting the threshold voltage for a second time after the step of forming two side gates.

2. The method as claimed in claim 1, wherein the insulating film includes an oxide film and a nitride film.

3. The method for fabricating a semiconductor device, comprising the steps of:
   (1) forming an insulating film on a first conduction type semiconductor substrate;
   (2) selectively removing the insulating film to expose the semiconductor substrate to form a trench;
   (3) implanting ions into the exposed semiconductor substrate for adjusting a threshold voltage for a first time;
   (4) forming a first gate insulating film on a surface of the exposed semiconductor substrate;
   (5) forming first and second side gates on the first gate insulating film at sides of the trench;
   (6) removing the first gate insulating film between the first and second side gates;
   (7) injecting ions into the exposed semiconductor substrate for adjusting the threshold voltage for a second time;
   (8) forming a second gate insulating film on surfaces of the first and second side gates and the exposed semiconductor substrate;
   (9) forming a main gate on the second gate insulating film between the first and second side gates; and,
   (10) removing the insulating film and forming source/drain impurity regions in the semiconductor substrate on sides of the first and second side gates.

4. The method as claimed in claim 3, wherein the step of forming a main gate includes the steps of;
   forming a conductive layer on an entire surface of the substrate, and
   removing the conductive layer by photolithography or E-beam, to leave the conductive layer between the first and second side gates.

5. The method as claimed in claim 3, wherein the step of forming a main gate includes the steps of;
   forming a conductive layer on an entire surface of the substrate, and
   removing the conductive layer by CMP until a surface of the insulating film is exposed.

6. The method as claimed in claim 3, wherein the first gate insulating film and the second gate insulating film are formed by thermal oxidation.

7. A method for fabricating a semiconductor device, comprising the steps of:
   (1) forming a buffer oxide film and a nitride film on a first conduction type semiconductor substrate;
   (2) selectively removing the buffer oxide film and the nitride film to expose the semiconductor substrate and form a trench;
   (3) implanting ions into the exposed semiconductor substrate for adjusting a threshold voltage for a first time;
   (4) forming oxide film sidewalls at inside walls of the trench;
   (5) forming a first gate insulating film on a surface of the exposed semiconductor substrate;
   (6) forming a first and a second side gates on the first gate insulating film at sides of the trench;
   (7) removing the first gate insulating film between the first and second side gates;
   (8) injecting ions into the exposed semiconductor substrate for adjusting the threshold voltage for a second time;
   (9) forming a second gate insulating film on surfaces of the first and second side gates and the exposed semiconductor substrate;
   (10) forming a main gate on the second gate insulating film between the first and second side gates;
   (11) forming an oxide film on a surface of the main gate; and,
   (12) removing the nitride film using phosphoric acid solution, and forming source/drain impurity regions in the semiconductor substrate on sides of the first and second side gates.

8. The method as claimed in claim 7, wherein the ions injected into the exposed semiconductor substrate for adjusting the threshold voltage for the first time are B ions.

9. The method as claimed in claim 7, wherein the ions injected into the exposed semiconductor substrate for adjusting the threshold voltage for the second time are $BF_2$ ions.

* * * * *